(12) United States Patent
Tomomatsu et al.

(10) Patent No.: US 8,298,854 B2
(45) Date of Patent: Oct. 30, 2012

(54) METHOD OF MANUFACTURING PIN PHOTODIODE

(75) Inventors: Hiroyuki Tomomatsu, Oita (JP); Akihiro Sugihara, Oita (JP); Motoaki Kusamaki, Oita (JP); Tohru Kato, Tokyo (JP)

(73) Assignee: Texas Instruments Incorporated, Dallas, TX (US)

( * ) Notice: Subject to any disclaimer, the term of this patent is extended or adjusted under 35 U.S.C. 154(b) by 1133 days.

(21) Appl. No.: 12/169,082

(22) Filed: Jul. 8, 2008

(65) Prior Publication Data

US 2009/0016200 A1    Jan. 15, 2009

(30) Foreign Application Priority Data

Jul. 9, 2007    (JP) .................. 2007-179604

(51) Int. Cl.
*H01L 21/00*    (2006.01)
(52) U.S. Cl. ............... 438/74; 438/57; 438/65; 438/72; 257/E31.061; 257/E27.133
(58) Field of Classification Search ............. 257/184, 257/290, 291, 292, 431, 434, 436, 437, 458, 257/461, 463, E31.054, E31.061, E27.133; 438/57, 65, 72, 74
See application file for complete search history.

(56) References Cited

U.S. PATENT DOCUMENTS

| 6,580,109 B1* | 6/2003 | Thomas et al. ............ 257/292 |
| 7,348,615 B2* | 3/2008 | Koizumi ................... 257/292 |
| 2005/0139753 A1* | 6/2005 | Park et al. ................ 250/214.1 |
| 2010/0155910 A1* | 6/2010 | Gaebler .................... 257/649 |
| 2011/0031381 A1* | 2/2011 | Tay et al. ................. 250/226 |

\* cited by examiner

*Primary Examiner* — Eduardo A Rodela
(74) *Attorney, Agent, or Firm* — Alan A. R. Cooper; Jacqueline J. Garner; Frederick J. Telecky, Jr.

(57) ABSTRACT

The objective of this invention is to provide a type of photodiode and the method of manufacturing the photodiode characterized by the fact that it has a higher photoelectric conversion efficiency (sensitivity) than that in the prior art. PIN photodiode 100 has a p-type silicon substrate, p-type silicon layer 112, n-type silicon layer 114 formed on p-type silicon layer 112 and having a junction plane with silicon layer 112, n-type low-resistance silicon region 116 that is formed to a prescribed depth from the surface of silicon layer 114 and has an impurity concentration higher than that of silicon layer 114, silicon oxide film 120 formed on silicon region 116, and silicon nitride film 122 formed on silicon oxide film 120.

9 Claims, 9 Drawing Sheets

| ITEM | PHOTOELECTRIC CONVERSION EFFICIENCY | BW (BANDWIDTH) |
|---|---|---|
| THEORETICAL THRESHOLD | 0.327 A/W | *** |
| PIN PHOTODIODE IN PRIOR ART | 0.284 A/W | 240 MHz |
| PIN PHOTODIODE IN THIS APPLICATION EXAMPLE | 0.319 A/W | 334 MHz |

METHOD OF MANUFACTURING PIN PHOTODIODE

FIELD OF THE INVENTION

The present invention pertains to a type of photodiode used in an optical pickup or other light receiving element. In particular, the present invention pertains to a type of PIN photodiode that can receive wavelengths of blue light with high sensitivity.

BACKGROUND OF THE INVENTION

The PIN photodiode is an element that has a P-I-N structure with an intrinsic layer (high resistance epitaxial layer or the like) between a p-type semiconductor and an n-type semiconductor, and that converts incident light to a photocurrent. Its principle of operation is as follows: when light with energy higher than the band-gap energy is incident on silicon (Si) having a PIN structure with a reverse bias applied to it, electron-hole pairs are generated in the silicon crystal. As photocarriers, electrons move to the N layer, while holes move to the P layer, and a back current is output.

Figure 6A:
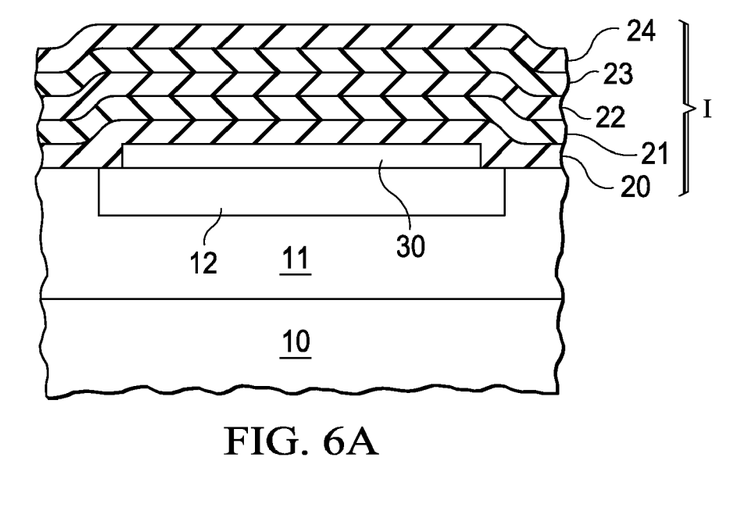
FIG. 6 is a cross section illustrating the constitution of a PIN photodiode in the prior art.
Figure 6B:
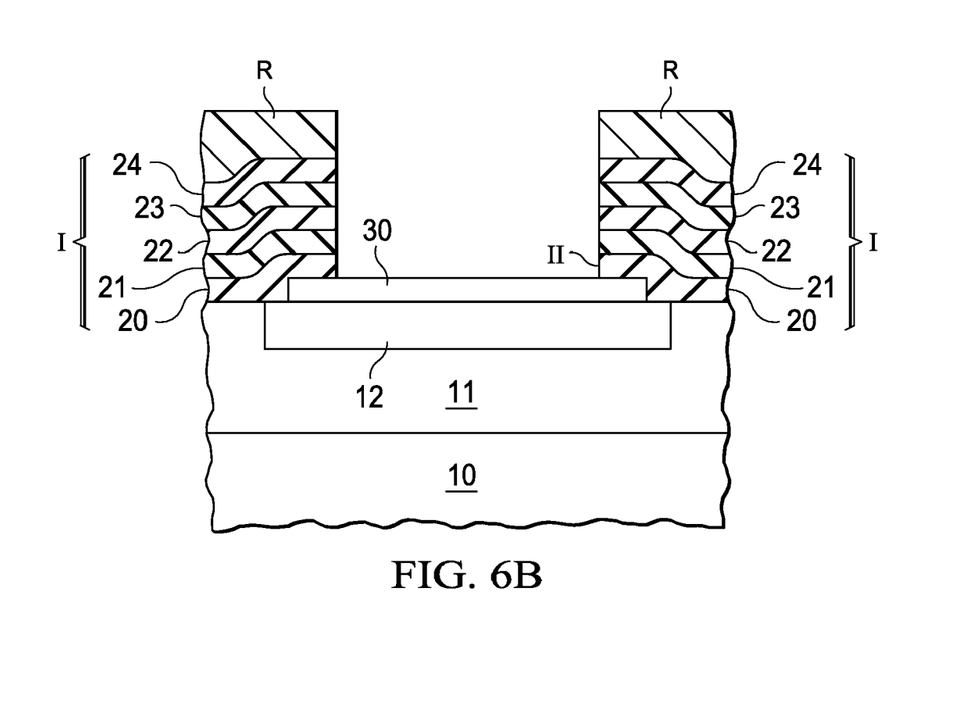

For example, Patent Reference 1 has disclosed a method of manufacturing a photodiode characterized by the following facts: as shown in FIG. 6(a), p-type semiconductor layer 12 is formed on the outer layer of n-type semiconductor layer 11; mask layer 30 and insulating layer I are formed on p-type semiconductor layer 12; and, as shown in FIG. 6(b), with mask layer 30 being used as an etching stopper, opening H is formed in insulating layer I; and mask layer 30 within opening H is removed by means of wet etching to form the photodiode. As a result, it is possible to inhibit leakage caused by etching damage.

Figure 7A:
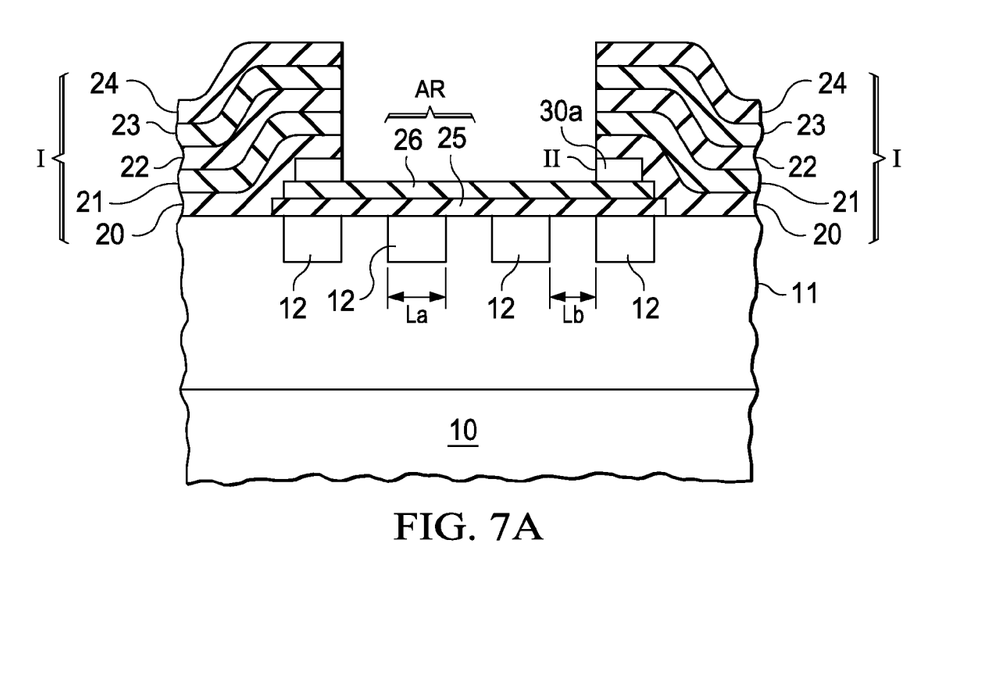
FIG. 7 is a cross section illustrating the constitution of a PIN photodiode in the prior art.
Figure 7B:
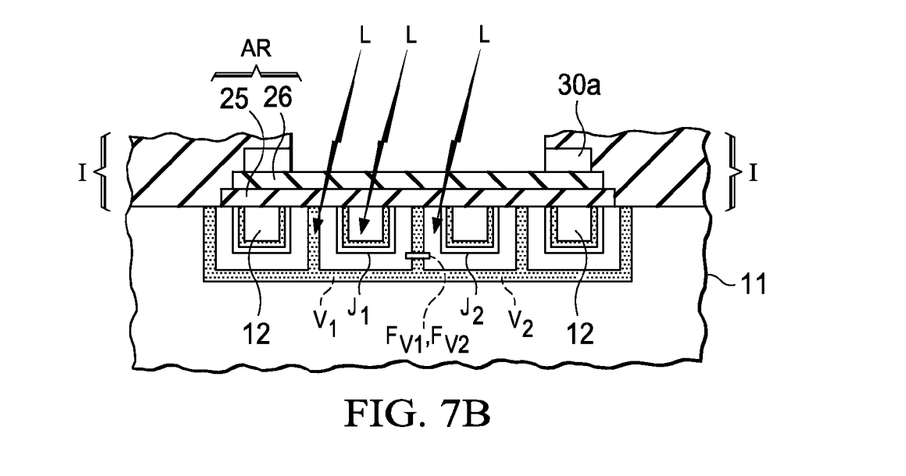

In addition, Patent Reference 1 has disclosed a type of photodiode characterized by the following facts: as shown in FIG. 7, plural p-type semiconductor layers 12 are formed in a checkerboard configuration in n-type semiconductor layer 11, and antireflection film AR made of silicon oxide film 25 and silicon nitride film 26 is formed on the silicon surface to create the photodiode.

[Patent Reference 1] Japanese Kokai Patent Application No. 2001-20079

Due to its properties, silicon can only convert light with wavelengths in the range of 400-1100 nm into a photocurrent for output. This is because the photon energy of light with a wavelength longer than 1100 nm is lower than the band-gap energy (1.12 eV) of silicon, so that the electron-hole pair cannot be formed. On the other hand, the short-wavelength light can generate the electron-hole pair only near the silicon surface. Because the silicon surface usually has a very high recombination speed, the electron-hole pairs formed under light with a wavelength shorter than 400 nm are immediately recombined, and the photocarriers in the silicon are annihilated.

Figure 8:
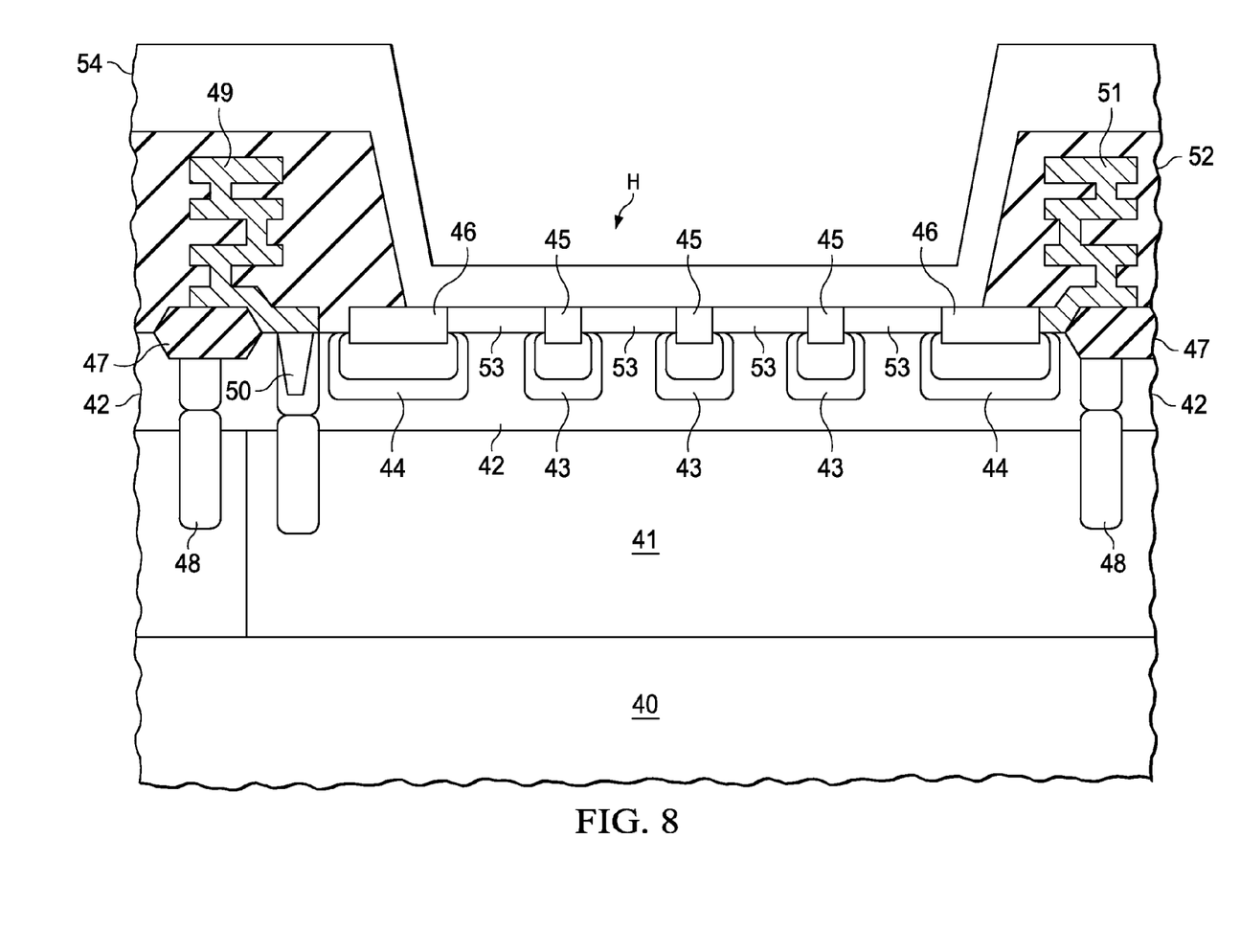
FIG. 8 is a cross section illustrating the constitution of a PIN photodiode in the prior art.

The PIN photodiode has two important characteristics, namely sensitivity (photoelectric conversion efficiency) and BW (response speed). FIG. 8 is a cross section illustrating a PIN photodiode with a constitution formed taking into consideration said two important characteristics with respect to the blue light wavelength ($\lambda$=405 nm) based on the fundamental principle of the PIN photodiode. As shown in the figure, low concentration p-type silicon layer 41 is formed on high-concentration p-type monocrystalline silicon substrate 40, and low concentration n-type silicon layer 42 is formed by epitaxial growth on said p-type silicon layer. When a reverse bias voltage is applied, a depletion region is formed between said p-type silicon layer 41 and n-type silicon layer 42, and when light is incident on it, electron-hole pairs are generated.

Intermediate concentration n-type silicon regions 43, 44 are formed in n-type silicon layer 42. Plural silicon regions 43 are arranged in a grid configuration on the light receiving plane. High concentration n-type contact regions are formed in said silicon regions 43, 44, respectively, and contact regions are respectively connected to the platinum silicide (PtSi) or other electrodes 45, 46.

High concentration p-type channel stop region 48 connected to p-type silicon layer 41 is formed below field oxide film 47. Metal wiring 49 is electrically connected via high concentration p-type contact region 50 to p-type silicon layer 41, and metal wiring 51 is connected to electrode 46. Electrode 45 within the light receiving plane is electrically connected to metal wiring 51 at a position not shown in the figure. Multilayer insulating layer 52 is formed on field oxide film 47. Opening H is formed in multilayer insulating layer 52 to define the light receiving plane. The silicon surface exposed in opening H is covered with silicon nitride film 53, and its upper surface is covered with silicon nitride protective film 54.

With a reverse bias voltage applied between metal wirings 49, 51, a depletion region is formed between p-type silicon layer 41 and n-type silicon layer 42. Because n-type silicon layer 42 is much thinner than p-type silicon layer 41, the depletion region reaches the silicon surface. Electron-hole pairs are generated in the depletion region when light is incident on it. The holes flow from p-type silicon layer 41 to metal wiring 49, electrons flow to electrode 45 near the depletion region, and the current obtained by photoelectric conversion is output.

Grid-like high concentration silicon regions 43 and electrodes 45 are placed near the surface in the PIN photodiode so that the short wavelength blue light can generate photocarriers near the surface of silicon. As a result, a low concentration layer is formed between the grids, the depletion layer can spread effectively, and photocarriers can be generated even at the blue light wavelength. Because said grid-like high concentration silicon regions 43 and electrodes 45 are arranged adjacent to the depletion region where the photocarriers are generated, the generated photocarriers can move smoothly through high concentration silicon regions 43 toward electrodes 45 before being annihilated in silicon to form a photocurrent, and the photoelectric conversion efficiency is optimized with respect to the blue light wavelength. Here, the photoelectric conversion efficiency refers to the ratio of the current obtained by photoelectric conversion to the power of the incident light.

The photoelectric conversion efficiency is as high as about 0.284 A/W for a PIN photodiode using the blue light wavelength with this constitution. However, the theoretical threshold is 0.327 A/W, which has not yet been reached. In order to achieve a value nearer to the theoretical threshold, electrodes 45 should not be positioned within the light receiving plane (opening H). Said electrodes 45 within the light receiving plane block the incident light, so that the number of carriers generated in the depletion region decreases and the photocurrent therefore falls, contributing significantly to a decrease in the photoelectric conversion efficiency. On the other hand, if there are no electrodes 45 in the light receiving plane, the travel distance of the carriers increases and the proportion of carriers annihilated due to recombination of the carriers near the silicon surface becomes higher, leading to a decrease in the photoelectric conversion efficiency. This is an antinomy topic.

The purpose of the present invention is to solve the aforementioned problems of the prior art by providing a type of photodiode and a method of manufacturing the photodiode having a higher photoelectric conversion efficiency (sensitivity) than that in the prior art.

In addition, a purpose of the present invention is to provide a type of photodiode and a method of manufacturing the photodiode with a high photoelectric conversion efficiency for blue light or other short wavelength light.

SUMMARY OF THE INVENTION

The present invention provides a method of manufacturing a photodiode characterized by the fact that it has the following processing steps: on a first silicon layer of the first electroconductive type, a second silicon layer of the second electroconductive type is formed; a silicon region of the second electroconductive type and having an impurity concentration higher than that of the second silicon layer is formed at a prescribed depth from the surface of the second silicon layer; a silicon oxide film is formed on the surface at least including said silicon region; and an antireflection film is formed to cover a portion or the entirety of said silicon oxide film.

As a preferred scheme, said silicon oxide film is formed by thermal oxidation; antireflection film is a silicon nitride film; the film thickness of said silicon oxide film is about 50-120 Å and the film thickness of the silicon nitride film is about 400-600 Å; and the film thickness of the silicon nitride film depends on the wavelength of the blue light.

Also, the following scheme is preferred: the resistivity of said silicon region is 0.02-2 Ω·cm, the resistivity of the second silicon layer is 2-4 Ω·cm, the depth of said silicon region from the surface of the second silicon layer is about 0.5 Å, and the thickness of said second silicon layer is about double said depth; and said silicon region is formed by ion implantation of an impurity.

The following method of manufacturing a photodiode is preferred: the method of manufacturing a photodiode also has a processing step of formation of an insulating film to cover said antireflection film, a processing step in which an opening is formed in said insulating film to expose at least a portion of said antireflection film, and a processing step in which first and second electrodes are formed to provide electrical connection to said first silicon layer and said second silicon layer, respectively; said first and second electrodes are arranged on the outer side with respect to said opening.

The present invention provides a method of manufacturing a semiconductor device characterized by the fact that the method of manufacturing the semiconductor device containing a photodiode and MOS transistor has the following processing steps: on a first silicon layer of the first electroconductive type, a second silicon layer of the second electroconductive type is formed; a silicon region of the second electroconductive type and having an impurity concentration higher than that of the second silicon layer is formed at a prescribed depth from the surface of the second silicon layer; when the gate oxide film of said MOS transistor is formed, said gate oxide film is formed on the surface of said silicon region; an antireflection film is formed to cover a portion or the entirety of said silicon oxide film of the photodiode; and an opening is formed in the insulating film formed on the antireflection film to expose at least a portion of the antireflection film.

The present invention provides a type of photodiode characterized by the fact that it has the following parts: a substrate, a first silicon layer of the first electroconductive type formed on the substrate, a second silicon layer of the second electroconductive type formed on said first silicon layer and including the junction plane with said first silicon layer, a silicon region of the second electroconductive type formed at a prescribed depth from the surface of said second silicon layer and having an impurity concentration higher than that of the second silicon layer, a silicon oxide film formed on said silicon region, an antireflection film formed on said silicon oxide film, and an insulating film with an opening formed in it to expose at least a portion of said antireflection film.

As a preferred scheme, the photodiode also has a first electrode and a second electrode on the outer side with respect to said opening; the first electrode is electrically connected to the first silicon layer; and the second electrode is electrically connected to the second silicon layer. The aforementioned photodiode includes an optical pickup or other light receiving device, and the light receiving device receives a portion of the light exiting from said light source or the light reflected from said recording medium.

REFERENCE NUMERALS AND SYMBOLS AS SHOWN IN THE DRAWINGS

In the figures, 60 represents an optical pickup, 62 represents a light source, 64 represents a splitter, 66 and 68 represent a light receiving device, 70 represents a semiconductor silicon chip, 72 represents a peripheral circuit, 100 represents a PIN photodiode, 110 represents a p-type silicon substrate, 112 represents a low concentration p-type silicon layer, 114 represents a low concentration n-type silicon layer, 116 represents an intermediate concentration n-type silicon region, 118 represents a field oxide film, 120 represents a silicon oxide film, 122 represents a silicon nitride film, 124 represents a high concentration n-type contact region, 126 represents a silicide layer, 128 represents a electrode, 130 represents a high concentration p-type contact region, 132 represents a silicide layer, 134 represents an electrode, 136 represents a multilayer insulating film, 138 represents a protective film, 150, 162 and 164 represent a resist mask, 152 represents an opening, 154 represents an ion implantation, 160 represents a polysilicon layer, H represents an opening.

DESCRIPTION OF THE EMBODIMENTS

Compared with the conventional photodiode, the photodiode of the present invention has a higher photoelectric conversion efficiency without a decrease in the response speed for the blue light wavelength. In addition, by using the photodiode of the present invention in an optical pickup, it is possible to read data from a recording medium or write data with high precision.

In the following, the optimum embodiment of the present invention will be explained in more detail with reference to figures. This explanation will be made with respect to an example of a PIN photodiode for use as the light receiving element of an optical pickup having a blue light source for reading data from a DVD or other recording medium or for writing data.

Figure 1:
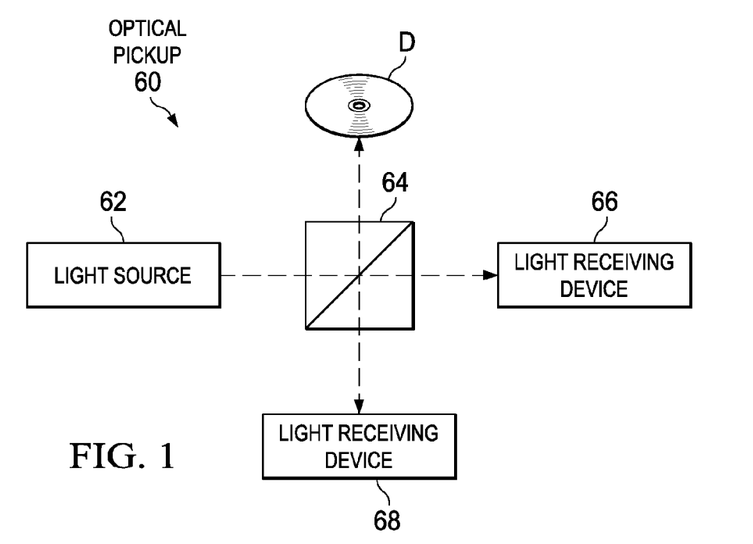
FIG. 1 is a diagram illustrating an example of the optical pickup using the PIN photodiode in the application example of the present invention.

FIG. 1 is a diagram illustrating an example of the constitution of the optical pickup. Here, optical pickup 60 performs optical reading of the data recorded on a disk driven to rotate, or optical writing of the data. Said optical pickup 60 has light source 62 containing a blue light-emitting laser element or laser diode, splitter 64, and light receiving devices 66, 68. Said splitter 64 reflects the blue light emitted from light source 62 onto disk D, and at the same time lets a portion of the light pass through it to go to light receiving device 66. In addition, the light reflected from disk D also passes through it toward light receiving device 68. Said light receiving device 66 monitors the light output from light source 62, and stabilizes the optical output of blue light based on the monitoring result. Said light receiving device 68 monitors the light reflected from disk D, and performs focusing and tracking control based on the result. Light receiving device 68 also is used in reading the data written on disk D.

Figure 2:
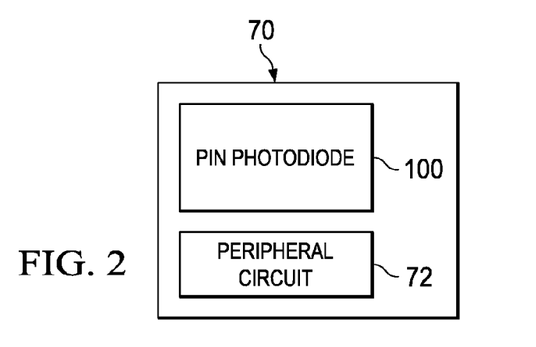
FIG. 2 is a diagram illustrating an example of the circuit formed on the silicon chip of the light receiving device shown in FIG. 1.

Each of light receiving devices 66, 68 contains a PIN photodiode for receiving the blue light. Said light receiving devices 66, 68 can each contain a peripheral circuit for amplifying or processing the signal detected by the PIN photodiode. For example, as shown in FIG. 2, PIN photodiode 100 and its peripheral circuit 72 can be integrated in a single semiconductor-silicon chip 70. Here, peripheral circuit 72 is an integrated circuit containing plural MOS transistors, etc.

Figure 3:
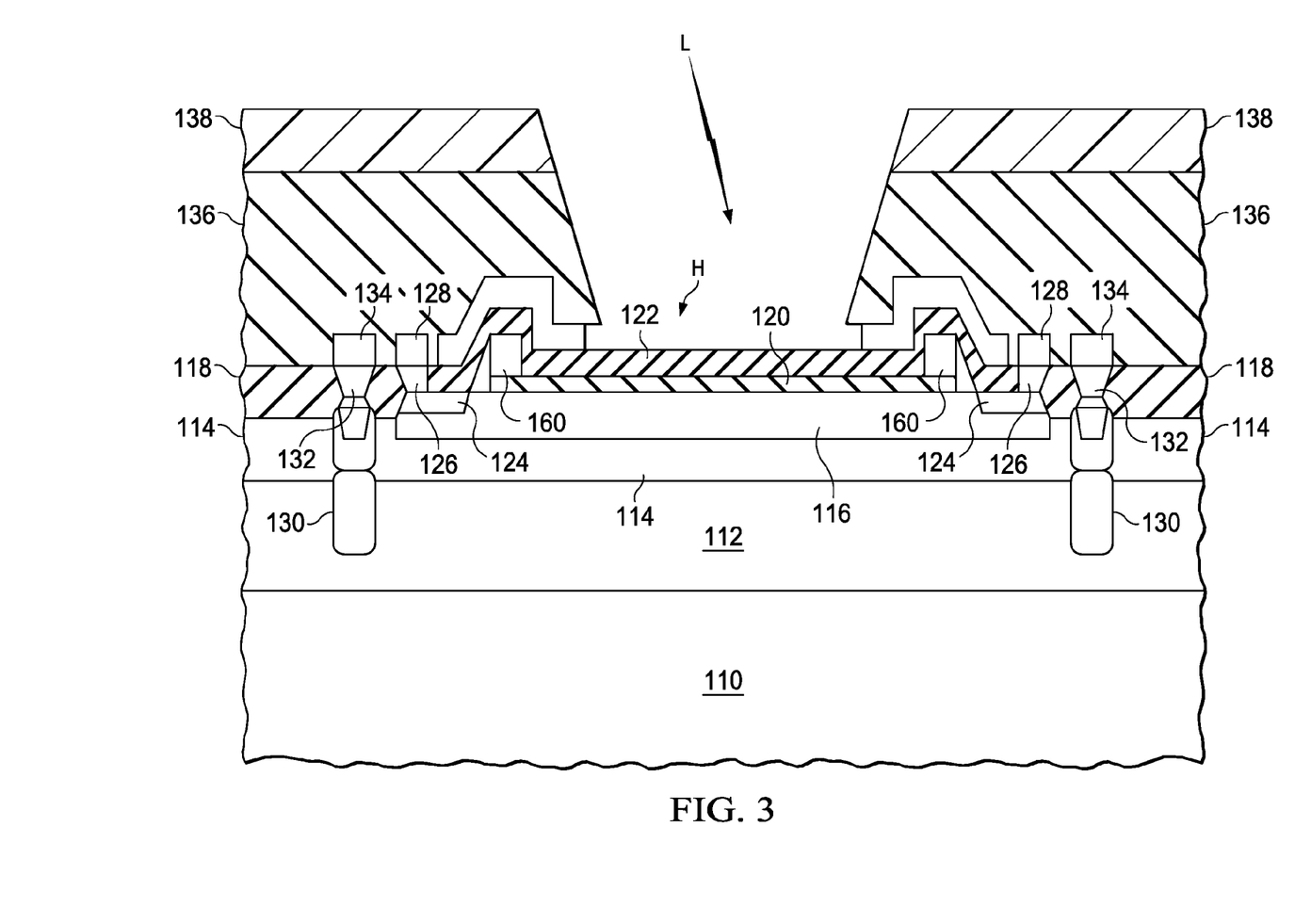
FIG. 3 is a cross section illustrating schematically the constitution of the PIN photodiode in the application example of the present invention.

FIG. 3 is a cross section illustrating the structure of the PIN photodiode in an application example of the present invention. In PIN photodiode 100 of this application example, low concentration p-type silicon layer 112 formed by means of epitaxial growth, low concentration n-type silicon layer 114 formed by epitaxial growth, and intermediate concentration n-type silicon region 116 having a prescribed depth from the surface of silicon layer 114 are formed on high concentration p-type monocrystalline silicon substrate 110. When a reverse bias voltage is applied, the depletion region spreads up/down from the junction plane between silicon layer 112 and silicon layer 114.

Said silicon region 116 is defined by field oxide film 118. Thermal oxidation of silicon region 116 is performed to form silicon oxide film 120, and silicon nitride film 122 is formed on silicon oxide film 120. Said silicon oxide film 120 and silicon nitride film 122 form an antireflection film.

High concentration n-type contact region 124 is formed on each of the two end portions of n-type silicon region 116. Said contact region 124 is electrically connected via platinum silicide (PtSi) layer 126 to electrode 128. It also extends via n-type silicon layer 114 to p-type silicon layer 112 to form high concentration p-type contact region 130. Said contact region 130 is electrically connected via platinum silicide (PtSi) layer 132 to electrode 134.

In addition, multilayer insulating film 136 and protective film 138 are formed on the silicon substrate. Opening H is formed in said multilayer insulating film 136 and protective film 138 to expose silicon nitride film 122. Said opening H defines the light receiving plane of the PIN photodiode. When a reverse bias voltage is applied to electrode 128 on the cathode side and electrode 134 on the anode side, a depletion region is formed from the interface between silicon layer 112 and silicon layer 114. The depletion region almost reaches the silicon surface region, and when blue light is incident on opening H, electron-hole pair carriers are formed in the depletion region. The electrons move to electrode 128 on the cathode side, and the holes move to electrode 134 on the anode side and a photocurrent is output as a result.

In this application example, PIN photodiode 100 is different from the conventional photodiode shown in FIG. 8 in which grid-like electrodes are arranged on the light receiving plane. As explained above, in the prior art the electrodes in the light receiving plane block a portion of the incident light L, leading to a decrease in the quantity of incident light in the depletion region, and thus causing a decrease in the photoelectric conversion efficiency (sensitivity). On the other hand, the PIN photodiode of the present invention has essentially no electrodes blocking incident light L on the light receiving plane. Consequently, unlike in the conventional PIN photodiode having electrodes arranged there, it is possible to prevent a reduction in the quantity of incident light in the depletion region.

On the other hand, when electrodes are not arranged on the light receiving plane, the travel distance of the carriers generated in the depletion region near the silicon surface becomes greater, and the annihilation proportion due to recombination becomes higher. In particular, when there are plural silicon free bonds (dangling bonds) on the silicon surface, the carriers are trapped in the trap level of the silicon interface, and the probability of annihilation of the carriers due to recombination becomes higher. In this application example, because silicon oxide film 120 is formed by thermal oxidation on silicon region 116, the number of dangling bonds of silicon decreases, so that the interface state becomes stable, and the interface trapping phenomenon can be minimized. Also, silicon oxide film 120 is highly reflective of light, but by forming silicon nitride film 122 directly above silicon oxide film 120 it is possible to prevent the reflection of blue light L. Said silicon nitride film 122 is formed with an appropriate film thickness with respect to the blue light, without restriction by design or operating process.

In addition, when the resistance of the silicon surface becomes high, the carrier movement velocity becomes lower, and the response speed falls. In order to avoid this problem in this application example, high concentration n-type silicon region 116 is formed to a prescribed depth from the surface of n-type silicon layer 114. It is preferred that silicon region 116 have a depth of about 0.5 μm from the silicon surface. Taking into consideration the properties of silicon it is preferred that a depletion region be formed on the silicon surface to ensure that the blue light wavelength is absorbed by the silicon surface. Consequently, in order to ensure that high concentration silicon region 116 does not become a hindrance to formation of the depletion region, silicon region 116 is formed within a prescribed depth from the silicon surface. As a result, the carriers generated near the silicon surface move to silicon region 116 near the silicon surface with a low resistance, and it is possible to inhibit a decrease in the response speed.

Figure 4A:
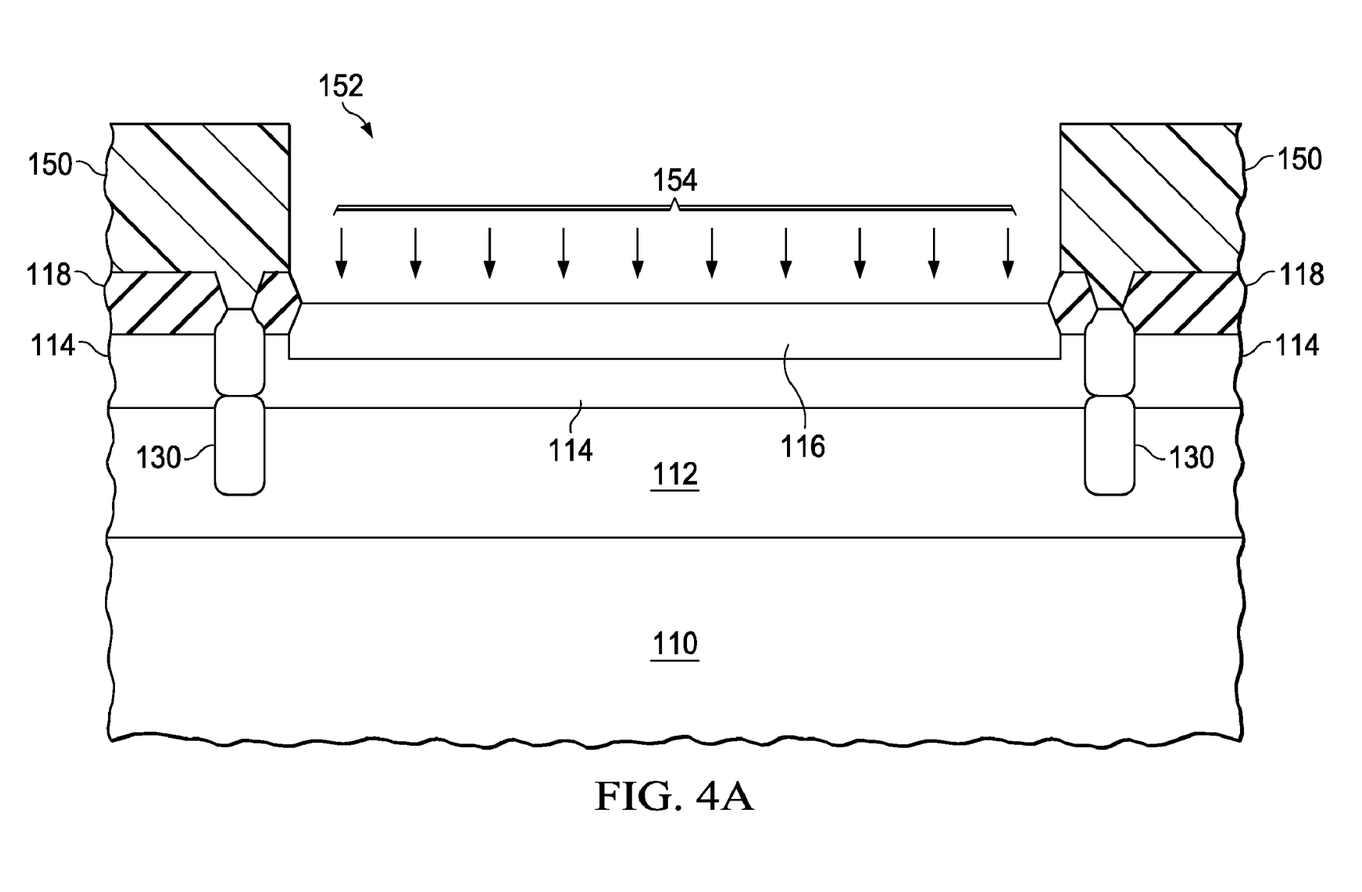
FIG. 4A is a schematic cross section illustrating the process of manufacturing the PIN photodiode in the application example of the present invention.

In the following, the manufacturing process of the PIN photodiode in this application example will be explained with reference to FIGS. 4A-4D. Here, as an example, the case will be explained in which the PIN photodiode and the MOS transistors of the peripheral circuit are formed on a semiconductor chip. As shown in FIG. 4A, first of all, high concentration p-type monocrystalline silicon substrate 110 is prepared. For example, silicon substrate 110 has a thickness of 610-640 μm and a resistivity (specific resistance) in the range of 0.01-0.02 Ω·cm. For example, boron is used as the impurity.

Low concentration p-type silicon layer 112 is formed by means of epitaxial growth on silicone substrate 110. For example, silicon layer 112 has a thickness of 25 μm and a resistivity of 1000-4000 Ω·cm. In addition, low concentration n-type silicon layer 114 is formed by means of epitaxial growth on silicon layer 112. For example, silicon layer 114 has a thickness of about 0.9 μm and a resistivity in the range of 2-4 Ω·cm. Also, high concentration p-type contact region 130 is formed at a depth from field oxide film 118 to reach p-type silicon layer 112. Said contact region 130 is formed by means of ion implantation of B (boron).

Resist mask 150 is formed on the silicon substrate formed with said constitution. Opening 152 is formed in resist mask 150 to expose silicon layer 114 defined by field oxide film 118. Thermal oxidation is performed on the surface of said exposed silicon layer 114 to form a silicon oxide film with thickness of about 300 Å for ion implantation. Then, ion implantation of P (phosphorus) or As (arsenic) is performed over the entire surface of the substrate via the silicon oxide film for ion implantation, and n-type silicon region 116 with an intermediate concentration is formed in silicon layer 114 left exposed by resist mask 150. Said silicon region 116 is formed with a depth of about 0.5 μm from the silicon surface, and has a resistivity of 0.02-2 Ω·cm.

Figure 4B:
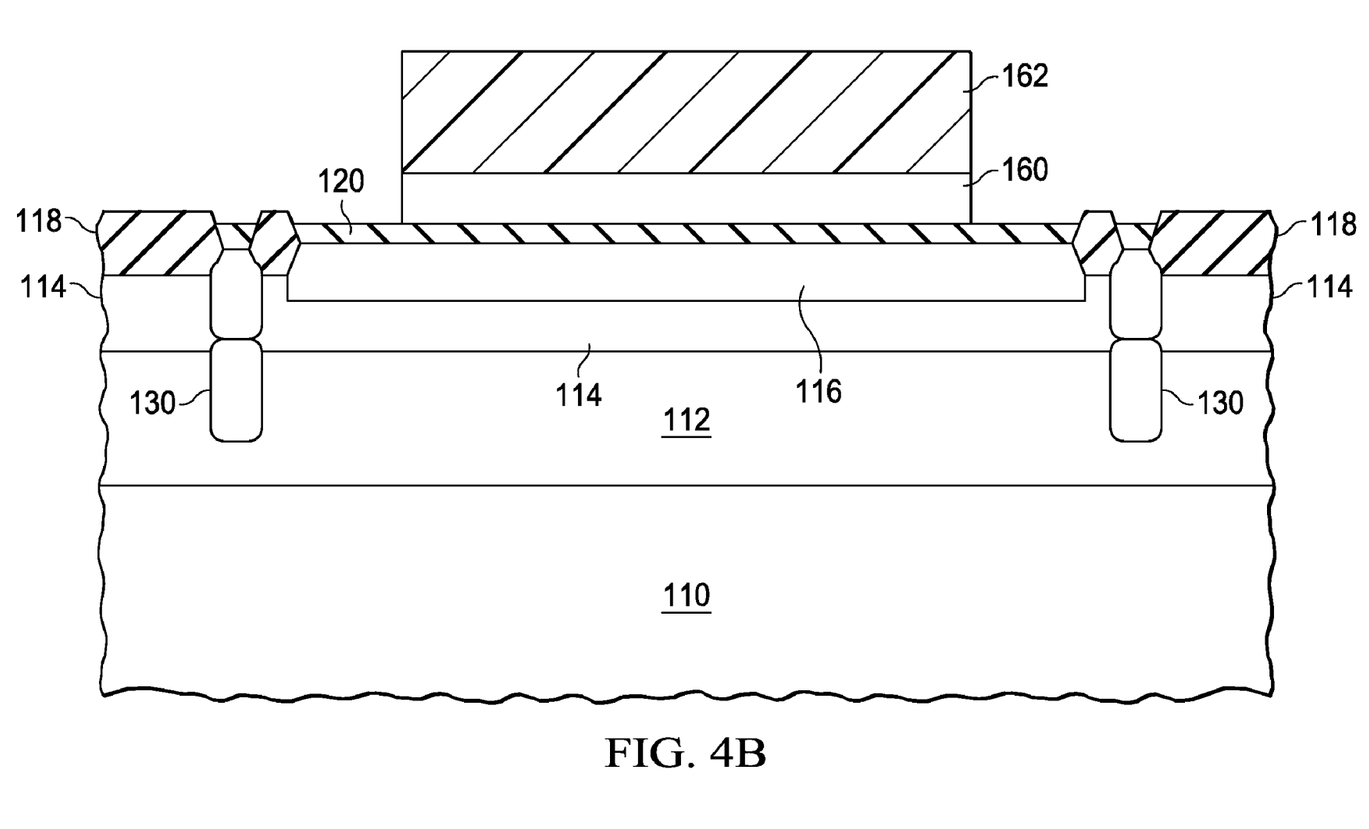
FIG. 4B is a schematic cross section illustrating process of manufacturing the PIN photodiode in the application example of the present invention.

After removal of the silicon oxide film for ion implantation and resist mask 150, as shown in FIG. 4B, silicon oxide film 120 is formed on silicon region 116. As explained above, when the MOS transistors of the peripheral circuit are formed on the silicon chip, the gate oxide film may be used as silicon oxide film 120. It is preferred that silicon oxide film 120 be formed by means of thermal oxidation performed such that the silicon substrate is exposed to a temperature in a prescribed range. It is preferred that silicon oxide film 120 be formed with a thickness of about 50-120 Å. Formation of silicon oxide film 120 causes the dangling bonds on the surface of the silicon to be bonded with oxygen, and the number of dangling bonds is reduced.

Polysilicon layer 160 is then formed on silicon oxide film 120. Said polysilicon layer 160 is used in the gate of the MOS transistor. Said polysilicon layer 160 has a thickness of about 3000-3750 Å. Resist mask 162 is formed on polysilicon layer 160 by means of a well-known photolithographic process, and polysilicon layer 160 is patterned via resist mask 162. Said polysilicon layer 160 protects silicon oxide film 120 until immediately proceeding the formation of silicon nitride film 122 on silicon oxide film 120.

Figure 4C:
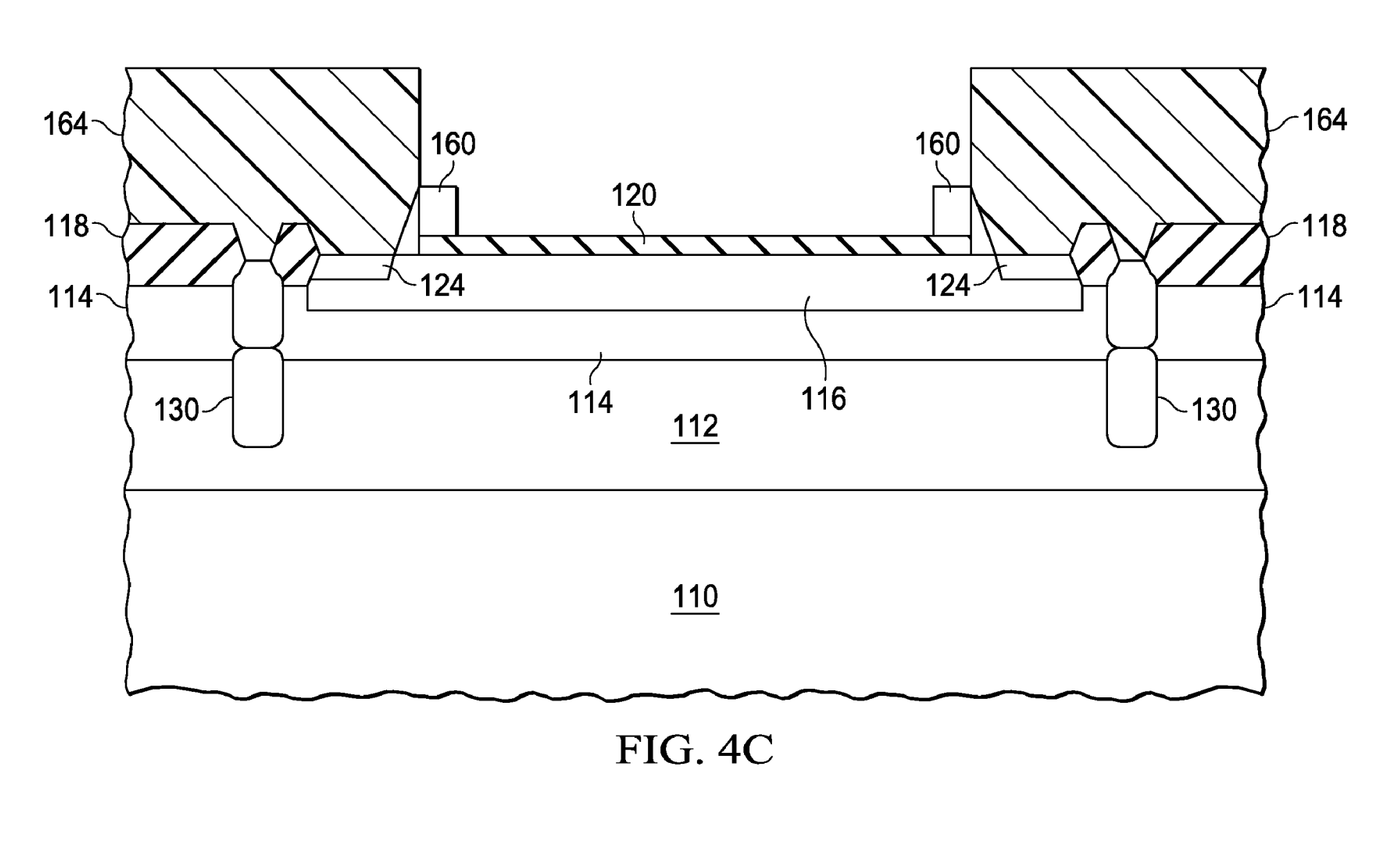
FIG. 4C is a schematic cross section illustrating the process of manufacturing the PIN photodiode in the application example of the present invention.
Figure 4D:
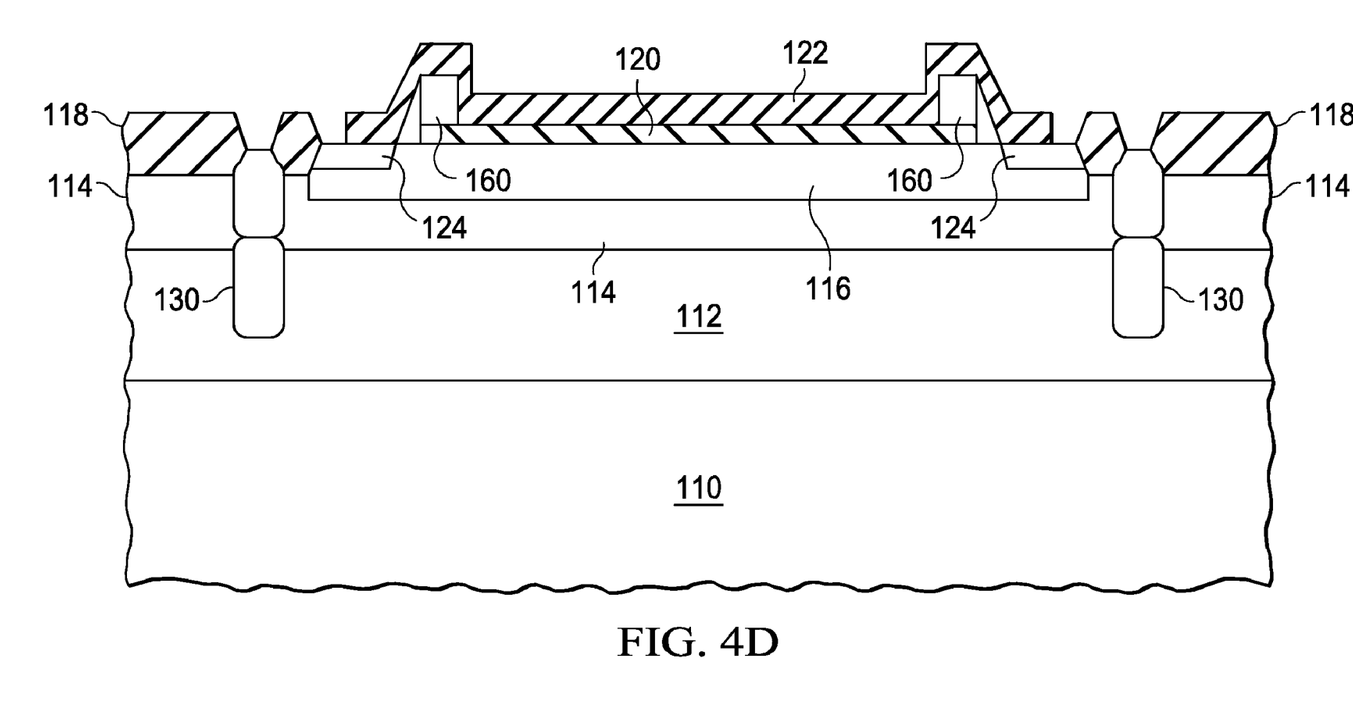
FIG. 4D is a schematic cross section illustrating the process of manufacturing the PIN photodiode in the application example of the present invention.

After the removal of resist mask 162, high concentration contact region 130 is formed on p-type silicon layer 112, and high concentration contact region 124 is formed in silicon region 116. As shown in FIG. 4C, resist mask 164 is formed on the silicon substrate, and polysilicon layer 160 is etched away via resist mask 164. As a result, silicon oxide film 120 is exposed. After the removal of resist mask 164, silicon nitride film 122 is formed as shown in FIG. 4D. It is preferred that silicon nitride film 122 be formed by means of reduced pressure CVD. When silicon oxide film 120 has the aforementioned film thickness, the film thickness of silicon nitride film 122 is preferably in the range of 400-600 Å. The film thickness of silicon oxide film 120 and silicon nitride film 122 is selected so that reflection of the blue light wavelength is minimized.

Figure 5:
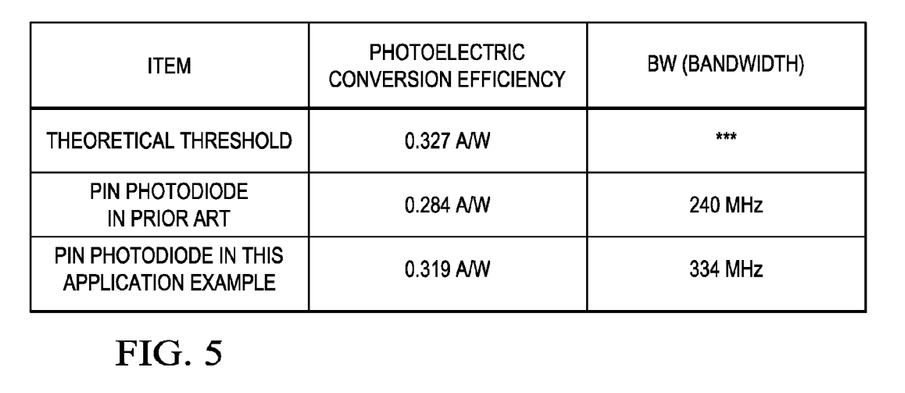
FIG. 5 is a diagram illustrating the characteristics of the PIN photodiode in this application example.

FIG. 5 is a diagram illustrating the results of measurement of the characteristics (measurement results) of the PIN photodiode with said constitution. The incident light has a wavelength of 405 nm, and the reverse bias voltage applied to the PIN photodiode is 2.0 V. As can be seen from the figure, the photoelectric conversion efficiency of the PIN photodiode in the prior art (structure shown in FIG. 8) is 0.284 A/W, and the photoelectric conversion rate of the PIN photodiode in this application example is 0.319 A/W. The value has been increased to near the theoretical threshold. In addition, while the bandwidth of the PIN photodiode of the prior art is 240 MHz, the bandwidth of the present application example is 334 MHz, and the response speed is also increased.

The above detailed explanation has provided for on the preferred embodiment of the present invention. However, the present invention is not limited to the prescribed embodiment. Various modifications can be made as long as the gist described in the claims is observed.

In the aforementioned application example, an explanation has been provided for the manufacturing method when PIN photodiode and MOS transistors as peripheral circuit are contained in the silicon chip. Of course, the present invention may also be applied to the method of manufacturing individual PIN photodiode transistors without MOS transistors. In addition silicon nitride film is used as the antireflection film in said application example. However, other dielectric films or their combination may also be adopted as the antireflection film. Furthermore, the structure of the antireflection film is not limited to two layers. More layers may also be adopted for the multilayer structure. In said application example, the silicon layer is formed on the silicon substrate by means of epitaxial growth. However, formation of it is not limited to epitaxial growth.

The invention claimed is:

1. A method of manufacturing a photodiode comprising the following steps:
   forming on a first silicon layer of a p-type, a second silicon layer of n-type;
   forming a silicon region of the n-type that has an impurity concentration higher than that of the second silicon layer at a prescribed depth from the surface of the second silicon layer;
   forming a silicon oxide film on the surface of at least said silicon region; and
   forming an antireflection film to cover a portion or the entirety of said silicon oxide film,
   wherein said silicon oxide film is formed by thermal oxidation;
   wherein said antireflection film is a silicon nitride film;
   wherein the film thickness of said silicon oxide film is about 50-120 Å, and the film thickness of the silicon nitride film is about 400-600 Å, and
   wherein the silicon oxide film decreases, on an interface between the silicon oxide film and a surface of the second silicon layer, a number of dangling bonds of silicon,
   the resistivity of said silicon region is 0.02-2 Ω·cm,
   the resistivity of the second silicon layer is 2-4 Ω·cm,
   the depth of said silicon region from the surface of the second silicon layer is about 0.5 Å, and the thickness of said second silicon layer is about double said depth.

2. The method of manufacturing a photodiode described in claim 1, wherein the film thickness of the silicon nitride film depends on the wavelength of the blue light.

3. A method of manufacturing a photodiode comprising the following steps:
   on a first silicon layer of the first electroconductive type, a second silicon layer of the second electroconductive type is formed;
   a silicon region of the second electroconductive type and having an impurity concentration higher than that of the second silicon layer is formed at a prescribed depth from the surface of the second silicon layer;
   a silicon oxide film is formed on the surface at least including said silicon region;
   and an antireflection film is formed to cover a portion or the entirety of said silicon oxide film; wherein:
   the resistivity of said silicon region is 0.02-2 Ω·cm,
   the resistivity of the second silicon layer is 2-4 Ω·cm,
   the depth of said silicon region from the surface of the second silicon layer is about 0.5 Å, and
   the thickness of said second silicon layer is about double said depth.

4. The method of manufacturing a photodiode described in claim 3, wherein said silicon region is formed by ion implantation of an impurity.

5. The method of manufacturing a photodiode described in claim 3, wherein the method of manufacturing a photodiode also has a processing step of formation of an insulating film to cover said antireflection film, a processing step in which an opening is formed in said insulating film to expose at least a portion of said antireflection film, and a processing step in which first and second electrodes are formed to provide electrical connection to said first silicon layer and said second silicon layer, respectively; said first and second electrodes arranged toward the outside of said opening.

6. A method of manufacturing a semiconductor device having a photodiode and MOS transistor comprising the following steps:
   forming on a first silicon layer a p-type, a second silicon layer of an n-type;
   forming a silicon region of the n-type and having an impurity concentration higher than that of the second silicon layer at a prescribed depth from the surface of the second silicon layer;
   forming a gate oxide film of said MOS transistor is formed on the surface of said silicon region;
   forming an antireflection film to cover a portion or the entirety of said silicon oxide film of the photodiode;
   and forming an opening in an insulating film formed on the antireflection film to expose at least a portion of the antireflection film,
   wherein said gate oxide film is formed by thermal oxidation;
   wherein said antireflection film is a silicon nitride film;
   wherein the film thickness of said silicon oxide film is about 50-120 Å, and the film thickness of the silicon nitride film is about 400-600 Å, and
   wherein said gate oxide film decreases, on an interface between said gate oxide film and a surface of said second silicon layer, a number of dangling bonds of silicon,
   the resistivity of said silicon region is 0.02-2 Ω·cm, wherein
   the resistivity of the second silicon layer is 2-4 Ω·cm,
   the depth of said silicon region from the surface of the second silicon layer is about 0.5 Å, and
   the thickness of said second silicon layer is about double said depth.

7. The method of manufacturing a semiconductor device described in claim 6, further comprising a processing step in which when the polysilicon gate film of said MOS transistor is formed, said polysilicon gate film is formed on said gate oxide film, and said antireflection film is formed after the removal of said polysilicon gate film.

8. A method of manufacturing a semiconductor device having a photodiode and MOS transistor comprising the following steps:
   on a first silicon layer of the first electroconductive type, a second silicon layer of the second electroconductive type is formed;
   a silicon region of the second electroconductive type and having an impurity concentration higher than that of the second silicon layer is formed; at a prescribed depth from the surface of the second silicon layer;
   when the gate oxide film of said MOS transistor is formed, said gate oxide film is formed on the surface of said silicon region;
   an antireflection film is formed to cover a portion or the entirety of said silicon oxide film of the photodiode;
   and an opening is formed in an insulating film formed on the antireflection film to expose at least a portion of the antireflection film
   further comprising a processing step in which when the polysilicon gate film of said MOS transistor is formed, said polysilicon gate film is formed on said gate oxide film, and said antireflection film is formed after the removal of said polysilicon gate film,
   wherein the resistivity of said silicon region is 0.02-2 Ω·cm, and its depth from the surface of the second silicon layer is about 0.5 μm.

9. The method of manufacturing a semiconductor device described in claim 8, wherein the film thickness of said gate oxide film is about 50-120 Å, and said antireflection film is a silicon nitride film with a film thickness of about 400-600 Å.

* * * * *